United States Patent [19]
Wagner et al.

[11] Patent Number: 5,311,530
[45] Date of Patent: May 10, 1994

[54] SEMICONDUCTOR LASER ARRAY

[75] Inventors: David K. Wagner, South Pasadena; Allen D. Danner, Pasadena, both of Calif.

[73] Assignee: Advanced Optoelectronics, Inc., City of Industry, Calif.

[21] Appl. No.: 760,488

[22] Filed: Sep. 16, 1991

Related U.S. Application Data

[63] Continuation-in-part of Ser. No. 583,170, Sep. 14, 1990, Pat. No. 5,107,091.

[51] Int. Cl.$^5$ .............................................. H01S 3/04
[52] U.S. Cl. ........................................ 372/36; 372/34
[58] Field of Search ..................................... 372/34, 36

[56] References Cited
U.S. PATENT DOCUMENTS 4,716,568  12/1987  Scifres et al. ..................... 372/36
5,105,429   4/1992  Mandinger et al. ................. 372/34

*Primary Examiner*—Georgia Y. Epps
*Attorney, Agent, or Firm*—Herbert M. Shapiro

[57] ABSTRACT

A laser bar structure is mounted on a submount which includes first and second side surfaces. The first side surface has an electrically-conducting elongated mesa adjacent to the rear surface defining a placement space for a laser bar. A conducting foil connects the laser bar to the mesa. A plurality of such submounts are stacked such that the rise of the mesas provide room for the lasers and the connections to them. Each submount has a through conduit which align when stacked to form a coolant manifold. The rear surface of the stack is mounted on a microchannel cooler. A single array or a plurality of arrays are assembled electrically in series between heat conducting end blocks with fittings for connection to a coolant supply.

13 Claims, 4 Drawing Sheets

SEMICONDUCTOR LASER ARRAY

REFERENCE TO RELATED PATENT APPLICATION

The present application is a continuation-in-part of copending U.S. patent application Ser. No. 07/583,170 filed Sep. 14, 1990, U.S. Pat. No. 5,107,091 and entitled --LASER DIODE ARRAY MOUNTING MODULE--.

FIELD OF THE INVENTION

This invention relates to semiconductor laser arrays and, more particularly, to stacked laser arrays.

BACKGROUND OF THE INVENTION

Semiconductor diode laser arrays are well known in the art. Such arrays operate to deliver high power pulses in a relatively narrow frequency range, preferably at a single frequency. The maximum power output of such arrays is limited by the heat generated by the lasers. Thus, the heat dissapation arrangement for the arrays is very important for the performance of the array. Further, the uniformity of the temperature to which the array is cooled also is particularly important because differences in temperature over the array results in an undesirable spread in the frequency range over which the output of the array is provided.

Commercially available diode lasers are mounted on heat sinks and are cooled by a fluid coolant to carry off the heat produced during operation. The cooling arrangements are expensive and cumbersome. When the lasers are stacked to form an array, the size of the array is, to a large extent, determined by the heat dissapating arrangement. It is desirable to reduce the size of that arrangement to reduce the area over which the output of the stack is delivered.

It is clear that the geometry of the individual laser structures, the manner in which the lasers are stacked, and the heat dissapating arrangements are all important to achieving high array performance.

BRIEF DESCRIPTION OF THE INVENTION

In accordance with the principles of this invention, individual lasers are soldered to submounts which then are stacked in a side-by-side arrangement. Each submount has a mesa on the side surface which abuts the adjacent submount in the stack. Each laser and submount is of elongated configuration defining an elongated laser channel at an emission surface and allowing a mesa to be defined which has a rectangular top surface to abut the adjacent submount.

Each submount includes a conduit arranged to align with conduits of adjacent submounts, when stacked, to form a single channel for coolant circulation through the stack. A laser is soldered to the submount in the space defined next to the mesa and an electrically-conducting foil defines a conducting path from the laser to the mesa.

The submounts are attached to one another by soldering the mesa of one submount to the side of the adjacent submount. The actual bonding area is very small. Thus, the stacks are fragile when first formed. To avoid damage to the array, each submount includes a pair of end wings for facilitating the handling of the lasers during fabrication and to provide bearing surfaces to engage a pair of rails in a jig used for assembly purposes.

The, thus formed, laser stack is mounted on a common microchannel cooler assembly well known in the art. The stack is prepared for mounting by pressing a film of polymer against the sides of the stack where the mesa ends are exposed. The polymer acts as an adhesive to provide rigidity to the stack while the stack is still supported in the assembly jig.

The back surface (opposite the emission surface) of each laser in a stack is covered with a thin thermally-insulating polymer film on which a pattern of the laser stack footprint is formed for attachment to a like pattern on the face of the microchannel cooler by cold solder bonding.

A plurality of laser arrays, as described above, can be stacked, again with aligned coolant conduits, to provide a common coolant circulating manifold. Whether a single array or a plurality of arrays are stacked, the array(s) are bolted together between heat conducting end blocks to which fittings to the coolant supply and sink are connected.

The individual arrays made according to the principles of this invention permit thirty lasers to be stacked in an area of 15 × 13 mm, providing up to 9,000 watt output pulses at a two percent duty cycle. The arrays are made with a succession of hard solder techniques in a modification of techniques utilized hitherto only in small area devices where heat dissapation is not an urgent requirement.

DETAILED DESCRIPTION OF AN ILLUSTRATIVE EMBODIMENT OF THIS INVENTION

Figure 1:
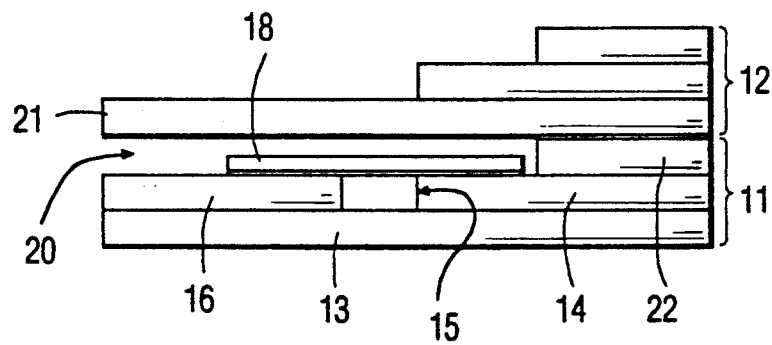
FIGS. 1, 2, and 3 are side, emission, and rear views of a segment of a laser stack in accordance with the principles of this invention.

FIG. 1 shows a side view of first and second submounts 11 and 12 for stacking lasers into an array. Each submount has a stepped profile comprising a base 13 of copper-tungsten and a mesa 14 of aluminum oxide. The rise 15 of the mesa defines a space for positioning a laser 16, as is clear from the figure, via a first cold solder procedure as is discussed more fully below.

A foil connection 18 provides electrical connection between a laser and the submount in a space 20 formed between adjacent submounts by the mesas when stacked. The space (20) is defined between a mesa (14) and the base 21 of the adjacent submount 12 by a second cold solder procedure employing copper pad 22 as is also described more fully below.

Figure 2:
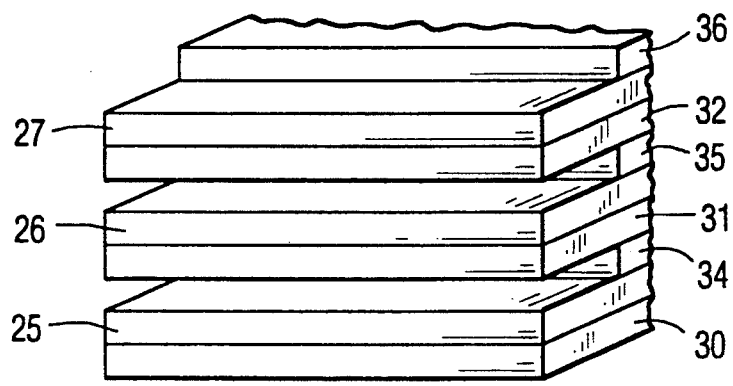

The lasers and submounts are elongated to provide elongated emission channels and supports in a stacked array as is clear from a front or emission face view of the stack as shown in FIG. 2. Specifically, FIG. 2 shows lasers 25, 26, and 27,—on respective submount bases 30, 31, and 32. The recessed copper pads are designated 34, 35, and 36 respectively.

Figure 3:
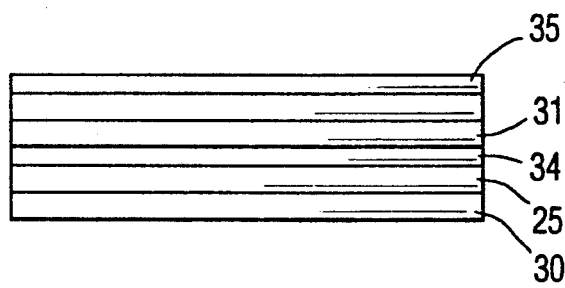

FIG. 3 shows the rear surface 39 opposite the emission surface of the stack. The rear surface is connected to a heat sink, preferably a microchannel structure well known in the art. The connection between the rear surface and the heat sink is made by a third cold solder technique involving a unique heat insulating layer as is more fully described below.

Figure 4:
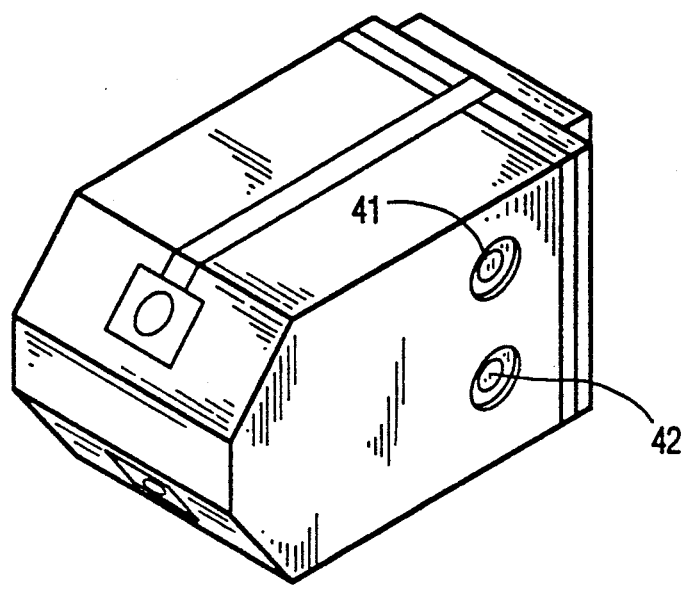
FIG. 4 is a schematic representation of a complete laser stack showing electrical and coolant connections.
Figure 6:
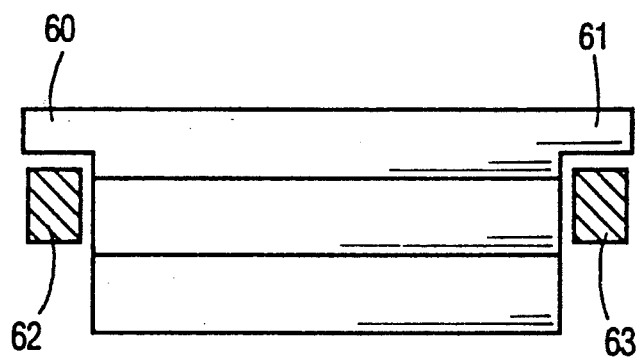
FIG. 6 is a top view of a submount for the laser stack of FIGS. 1-3.

FIG. 4 shows an isometric view of a finished laser stack. The stack includes conduits 41 and 42 for connection to a coolant supply and sink. The overall dimensions are 19×15×13 mm as is shown in the figure providing an output pulse of 9000 watts.

Figure 5:
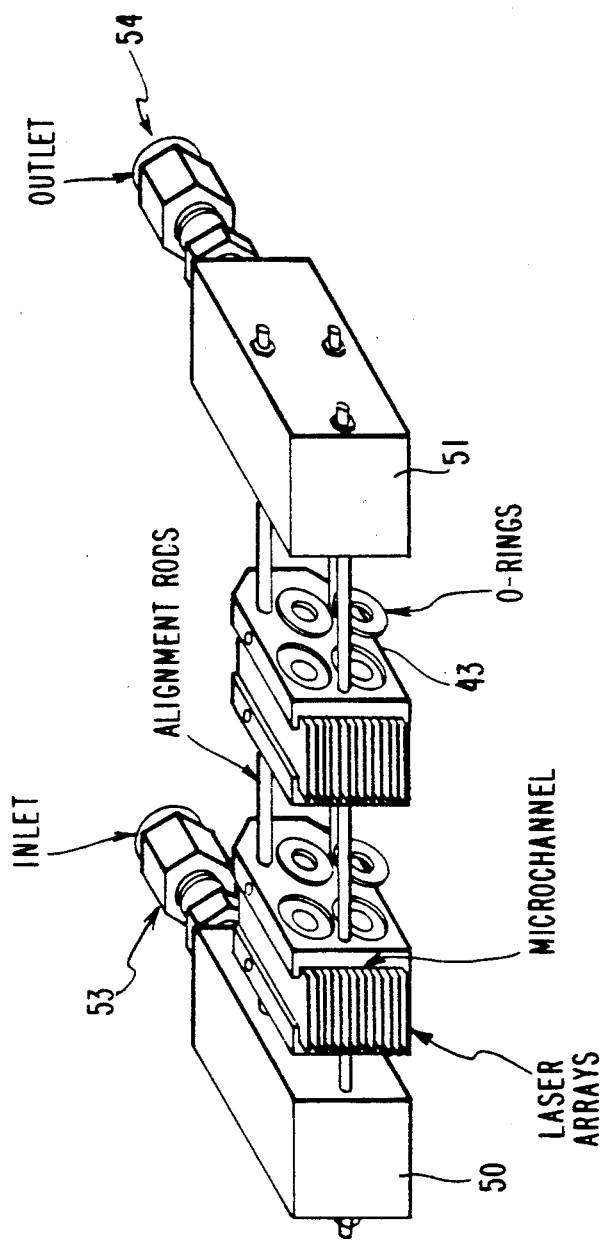
FIG. 5 is a schematic representation, partially exploded, of a plurality of laser stacks with end blocks and coolant connections.

The stack of FIG. 4 or a plurality of such stacks as shown in FIG. 5 are adapted by conduits, such as 41 and 42, and rods, such as 43 in FIG. 5 for serial interconnection between end blocks 50 and 51. The end blocks are mounting blocks to which coolant supply fittings 53 and 54 are connected. Up to six stacks of lasers of the type shown in FIGS. 1–4 are assembled conveniently at present.

As is clear from a consideration of the dimensions of the stack of FIGS. 1-3, the top surface of a mesa has a relatively small area. Because that top surface is the entire bonding surface to a next submount, the stack of submounts is initially quite fragile. Accordingly, to provide a realistic yield of stacks, the submounts are made with end wings 60 and 61 to permit ease of handling during the assembly of the stack. The wings engage rails 62 and 63 of an assembly jig for handling. Thus, a plurality of winged submounts, with lasers already positioned, engage the rails for the second cold soldering operation, the first cold soldering operation being the connection of a laser to a submount.

The procedure for interconnecting the various elements of a laser stack entails a sequence of cold solder operations and is a surprising adaptation of known techniques to an unexpected usage in fabricating devices which require invariant temperature conditions over a relatively large area. Such adaptations employ, in one instance, a film having apparant counterproductive properties, which applicants consider to constitute a significant departure from prior art thinking.

The sequence of cold solder operations and materials are discussed in connection with the flow diagram of FIG. 7. Laser bars (p side down) are bonded to the 90% tungsten/10% copper part of a submount using 80% gold/ 20% tin (m. p. 280° degree solder) preform as indicated in block 70 of FIG. 7. The contact part of the submount has the same thermal expansion as GaAs which enables the use of hard solders without creating problems of stress due to expansion mismatch.

Next, a foil bond of 100% gold is connected from the n-side of the laser bar to the gold plated aluminum oxide part of the submount. The gold foil is precoated by e-beam evaporation with 8 microns-tin/ 300 angstroms-gold solder (m.p.232° degrees C.). This step is shown in block 71 of FIG. 7.

The bar assembly is now complete. The assembly is tested and good devices are sent for burn in.

Selected bars are stacked on top of one another with a 60% lead/ 40% tin (m.p. 183°-187° degrees C.) or 90% tin/ 10% gold (m.p. 217° degrees C.) solder preform. The preform is placed on the gold coated copper pad of the composite submount as indicated in block 73 of FIG. 7. This bond constitutes the electrical connection between submounts and enables the stack to be operated in series. Two copper spacers are also bonded at the bottom and top ends of the stack to assist in the attachments of electrical clips.

Figure 7:
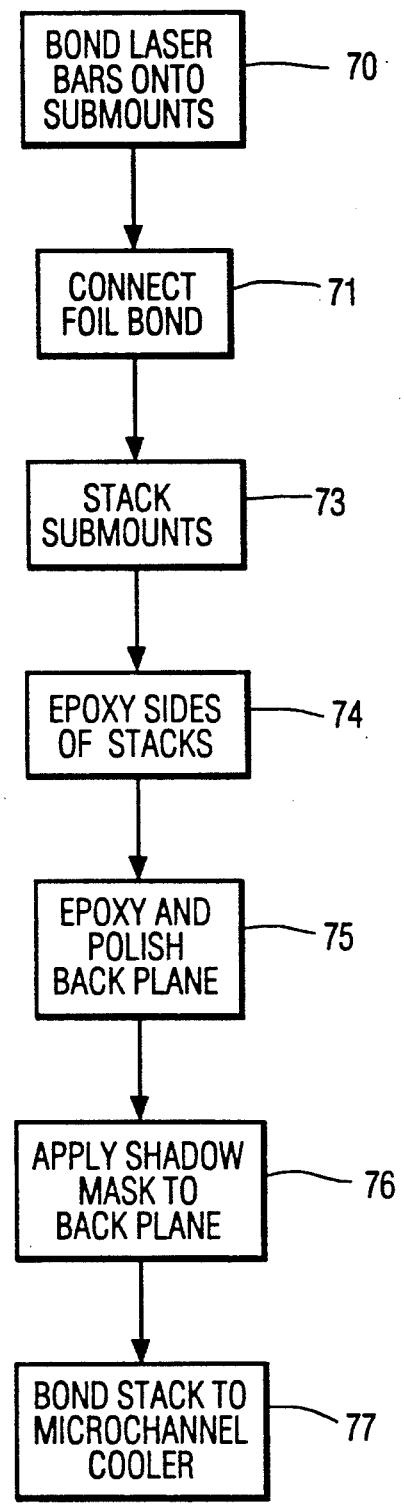
FIG. 7 is a flow diagram of the sequence of cold soldering steps for fabricating the stack of FIGS. 1-4.

An electrically insulating epoxy available in sheet form is precut and bonded to the two sides of the stack as shown in block 74 of FIG. 7. This epoxy, when cured, at 150° degrees C. for 30 minutes, gives rigidity to the stack.

A three micron layer of epoxy- an electrical insulator- is next applied to the back plane of the stack by spinning the polymer on. The polymer is then prebaked at 110° degrees C. for 30 minutes and then at 150° degrees C. for 90 minutes as indicated in block 74 of FIG. 7. The application of the polymer in this step fill the voids that may be present on the back plane at the interface between the submounts and further strengthens the stack.

The back plane of the stack is now hand polished in a special fixture. The fixture isolates the bar facets from any dust generated from polishing and also eliminates any contact to the front facet. Polishing is done by progressively going to finer grit sizes with final polish being carried out with 0.3 micron grit. The steps of epoxying and polishing of the back plane are indicated by block 75 of FIG. 7.

The stack is now removed and cleaned ultrasonically with solvents and dried under a heat lamp.

A three micron layer of polymer is again applied to the back plane followed remediately by the application of a two micron thick mylar film. The polymer, this time, acts as an adhesive for securing the mylar which, in turn, guarentees a continuous electrically-insulating film. The polymer is first cured at 110° degrees C. for 30 minutes and then at 150° degrees for 90 minutes.

A shadow mask is placed on the mylar coated back plane to achieve the desired bonding pad as indicated in block 76 of FIG. 7. The back plane is then metallized with Ti(1220 Angstroms)/Pd(500 angstroms)/ Au(4000 Angstroms).

The stack is now bonded to the microchannel cooler using 100% In (m.p.156° degrees) foil which is precut to the size of the bonding pad that has been patterned on the mylar. This step is indicated by block 77 of FIG. 7.

Electrical clips are attached to the end spacers of the stack by using either 51% In/49% S.% (m.p.118° degrees C.) or silver epoxy or electrically conductive precut epoxy.

What is claimed is:

1. A laser bar submount, said submount comprising a rigid base portion having first and second opposed broad area surfaces, said submount also including a mesa on said first surface, said mesa having a first rise and defining a laser bar placement space for a laser bar on said first surface.

2. A submount as set forth in claim 1 with a laser bar having a height corresponding to said first rise, secured to said placement space.

3. A submount as set forth in claim 2 with an electrically conducting foil connector secured to said laser bar and to a first portion of the surface of said mesa.

4. A submount as set forth in claim 1 wherein said mesa has first and second exposed surface portions, said second portion including a layer of electrically conducting material.

5. A submount as set forth in claim 4 having a through conduit for the circulation of coolants therethrough.

6. A submount as set forth in claim 5 in which said base portion comprises copper-tungsten alloy, said mesa comprises aluminum oxide, and said layer of electrically conducting material on said second portion of said mesa comprises copper.

7. A submount as set forth in claim 5, said submount having lateral extensions to said base for engaging a railed jig assembly.

8. A plurality of submounts as set forth in claim 7, the second portion of each of said mesas being joined to an aligned portion of the second side surface of the adjacent submount via respective electrically-conducting material to form a stack, said through conduits in said submounts being aligned to form an alignment channel.

9. A plurality of submounts as set forth in claim 4, the second portion of each of said mesas being joined to an aligned portion of the second surface of the adjacent submount via respective electrically-conducting material to form a stack, said through conduits being aligned to form an alignment channel.

10. A plurality of submounts as set forth in claim 8 wherein said laser bars form an emission surface and the opposing surface of said subamounts defines a rear surface, said rear surface being joined to a microchannel cooler.

11. A plurality of submounts as set forth in claim 4 also including end blocks secured thereto into a laser diode array mounting assembly.

12. A plurality of submounts as set forth in claim 10 wherein a film of heat-insulating material is positioned between said rear surface and said microchannel cooler.

13. A plurality of submounts as set forth in claim 6, the second portion of each of said mesas being aligned to an aligned portion of the second side surface of the adjacent submount via respective electrically-conducting material to form a stack, said through conduits being aligned to form an alignment channel.

* * * * *